(12) United States Patent
Jenkins et al.

(10) Patent No.: US 8,988,148 B2
(45) Date of Patent: Mar. 24, 2015

(54) TRANSCONDUCTANCE AMPLIFIER

(71) Applicants: Julian Jenkins, Kurraba Point (AU);
Torsten Lehmann, Earlwood (AU);
James Paul Koeppe, Middleton, WI (US)

(72) Inventors: Julian Jenkins, Kurraba Point (AU);
Torsten Lehmann, Earlwood (AU);
James Paul Koeppe, Middleton, WI (US)

( * ) Notice: Subject to any disclaimer, the term of this patent is extended or adjusted under 35 U.S.C. 154(b) by 0 days.

(21) Appl. No.: 14/106,493

(22) Filed: Dec. 13, 2013

(65) Prior Publication Data

US 2014/0167857 A1  Jun. 19, 2014

(30) Foreign Application Priority Data

Dec. 17, 2012  (AU) .............................. 2012905514

(51) Int. Cl.
| | | |
|---|---|---|
| *H03F 3/68* | (2006.01) | |
| *H03F 1/02* | (2006.01) | |
| *H03F 3/21* | (2006.01) | |
| *H03F 3/45* | (2006.01) | |

(52) U.S. Cl.
CPC .............. *H03F 1/0277* (2013.01); *H03F 3/211* (2013.01); *H03F 3/45475* (2013.01); *H03F 2203/45644* (2013.01)
USPC .......................................... 330/295; 330/252

(58) Field of Classification Search
USPC ........................ 330/295, 124 R, 84, 126, 252
See application file for complete search history.

(56) References Cited

U.S. PATENT DOCUMENTS

| | | | | | |
|---|---|---|---|---|---|
| 2,579,528 | A | * | 12/1951 | Williams | ...................... 330/117 |
| 5,315,267 | A | * | 5/1994 | Chambers | ...................... 330/262 |

* cited by examiner

*Primary Examiner* — Henry Choe
(74) *Attorney, Agent, or Firm* — André Grouwstra

(57) ABSTRACT

A transconductance amplifier has a pair of input terminals and a pair of output terminals. A first pair of transconductors is connected to the input terminals and the output terminals. A second pair of transconductors has inputs connected to output terminals, and outputs connected to the opposing output terminals. A third pair of transconductors has both its inputs and its outputs connected to the output terminals. One or more of the transconductors have a control port for a control signal to adjust its transconductance. The control signal may switch the transconductance of this or these transconductors between two or more values. One or more of the transconductors in the transconductance amplifier may include a tri-state inverter, which may be enabled or disabled through a control port.

24 Claims, 4 Drawing Sheets

TRANSCONDUCTANCE AMPLIFIER

CROSS REFERENCES TO RELATED APPLICATIONS

This application claims priority from Australian Provisional Patent Application Serial No 2012905514, entitled A Transconductance Amplifier, filed on Dec. 17, 2012, which is hereby incorporated by reference herein for all purposes.

BACKGROUND

The present invention relates to a transconductance amplifier and particularly to a transconductance amplifier with transconductance-adjustable elements.

A transconductance amplifier is an electronic stage which provides an output current in response to a voltage input. Ideally the output current is linearly proportional to the voltage input. The proportionality constant is known as the transconductance gain. Since the voltage output is the product of the output impedance and the output current, the voltage gain is the product of the transconductance gain multiplied by the output impedance.

In differential signal processing applications, mismatch of discrete components or elements of signal processing circuit may have an impact of the performance of the signal processing circuit. For a differential transconductance amplifier, for example, any mismatch may lead to a decrease in impedance and hence reduced gain. It is therefore desirable to reduce any mismatch to maximize the differential gain.

SUMMARY

According to a first aspect of the present invention there is provided a transconductance amplifier comprising a pair of input terminals for receiving an input signal; a pair of output terminals for providing an output signal; a first pair of transconductors each comprising: (a) an input port electrically coupled to a respective one of the pair of input terminals; and (b) an output port electrically coupled to a respective one of the pair of output terminals; a second pair of transconductors each comprising: (a) an input port electrically coupled to a respective one of the pair of output terminals; and (b) an output port electrically coupled to the other of the pair of output terminals; a third pair of transconductors each comprising: (a) an input port; and (b) an output port electrically coupled to its input port and also to a respective one of the pair of output terminals, wherein at least one of the transconductors includes a control port, different from a power supply port for receiving power, the control port to receive a control signal for adjusting transconductance of the at least one of the transconductors.

In embodiments the at least one of the transconductors may include a transconductance element of which the transconductance is switchable between two values by the control signal. The transconductance element may be configured to be enabled or disabled by the control signal.

In other embodiments the at least one of the transconductors may include an array of transconductance elements each of which has an associated control port, different from any power supply port for receiving power, with the transconductance of each transconductance element being switchable between two values by an associated control signal received via the associated control port. Each of the transconductance elements may be configured to be enabled or disabled by the associated control signal.

According to a second aspect of the present invention there is provided a transconductance amplifier comprising a pair of input terminals for receiving an input signal; a pair of output terminals for providing an output signal; a first pair of transconductors each comprising: (a) an input port electrically coupled to a respective one of the pair of input terminals; and (b) an output port electrically coupled to a respective one of the pair of output terminals; a second pair of transconductors each comprising: (a) an input port electrically coupled to a respective one of the pair of output terminals; and (b) an output port electrically coupled to the other of the pair of output terminals; a third pair of transconductors each having: (a) an input port; and (b) an output port electrically coupled to its input port and also to a respective one of the pair of output terminals, wherein at least one of the transconductors includes a tri-state inverter configured to operate substantially in its linear range.

In embodiments, the tri-state inverter may include an enable port for receiving a control signal for enabling or disabling the tri-state inverter. Each of the transconductors may include a tri-state inverter.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which.

DETAILED DESCRIPTION OF EMBODIMENTS

The present invention relates to a transconductance amplifier. Transconductance amplifiers are designed to provide a transconductance gain which is defined as a ratio between an output current and an input voltage of the transconductance amplifier. Additionally, depending on whether the transconductance amplifier drives a resistive, capacitive or inductive load (or any combination thereof), a voltage gain may exist. The unloaded voltage gain can be defined as the product of the transconductance gain and an output impedance of the amplifier. The design of the amplifier in accordance with the present invention is particularly suited for implementing a differential operational transconductance amplifier, configured to receive a pair of differential input signals via a pair of input terminals and further configured to provide or output a pair of different output signals via a pair of output terminals. As discussed in more detail below, the differential voltage gain of the amplifier may be optimized by individually controlling one or more transconductance elements of the amplifier.

In an example embodiment of its most general form, the transconductance amplifier of the present invention comprises (i) a pair of input terminals for receiving an input signal, (ii) a pair of output terminals for providing an output signal and various transconductor pairs. In particular, the transconductor amplifier comprises (iii) a first pair of transconductors each having an input port electrically coupled to a respective one of the pair of input terminals, and an output port electrically coupled to a respective one of the pair of output terminals. Also, (iv) a second pair of transconductors each having an input port electrically coupled to a respective one of the pair of output terminals and an output port electrically coupled to the other of the pair of output terminals and (v) a third pair of transconductors each having an input port and an output port electrically coupled to its input port and a respective one of the pair of output terminals are provided. In this general form, at least one of the transconductors of the amplifier includes a control port for receiving a control signal for adjusting transconductance of the at least one of the transconductors. This control port is different from power supply ports associated with transconductors and configured to provide power to the transconductors.

Simplified Structure

Figure 1:
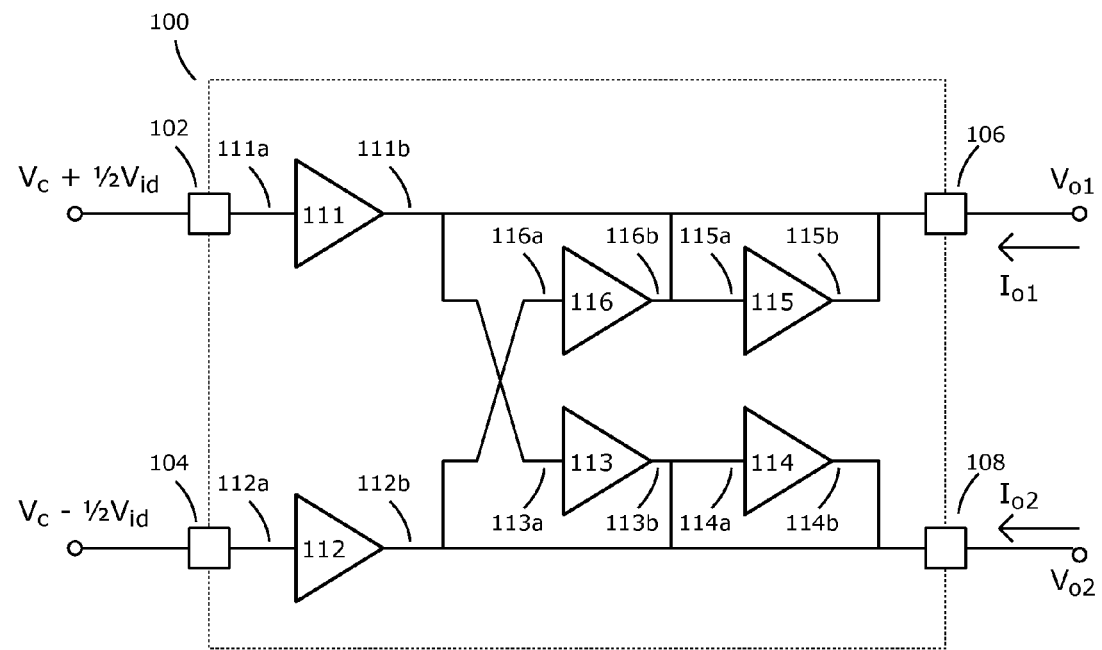
FIG. 1 illustrates a simplified structure of embodiments of a transconductance amplifier in accordance with the present invention.

FIG. 1 illustrates schematically a simplified structure of embodiments of a transconductance amplifier 100 in accordance with the present invention. The transconductance amplifier 100 in its simplified structure includes a pair of input terminals 102 and 104, a pair of output terminals 106 and 108 and three pairs of transconductors 111, 112; 113, 116; and 114 and 115.

As illustrated in FIG. 1, a first pair of transconductors 111 and 112 each has an input port 111a and 112a. The input port 111a is electrically coupled to the input terminal 102 whereas the input port 112a is electrically coupled to the input terminal 104. The first pair of transconductors 111 and 112 each also has an output port 111b and 112b. The output port 111b is electrically coupled to the output terminal 106 whereas the output port 112b is electrically coupled to the output terminal 108. Therefore the first pair of transconductors 111 and 112 may each be configured to provide a feed forward signal path from the input terminal 102 or 104 to the output terminal 106 or 108 of the transconductance amplifier 100.

A second pair of transconductors 113 and 116 each has an input port 113a and 116a. The input port 113a is electrically coupled to the output terminal 106 whereas the input port 116a is electrically coupled to the output terminal 108. The second pair of transconductors 113 and 116 each also has an output port 113b and 116b. The output port 113b is electrically coupled to the output terminal 108 whereas the output port 116b is electrically coupled to the output terminal 106. The second pair of transconductors 113 and 116 may thus each be configured to cross-couple the output terminals 106 and 108 of the transconductance amplifier 100.

Similarly, a third pair of transconductors 114 and 115 each has an input port 114a and 115a as well as an output port 114b and 115b. Input port 115a is electrically coupled to the output port 115b as well as to the output terminal 106. Similarly input port 114a is electrically coupled to output port 114b as well as to output terminal 108. Therefore, each of the third pair of transconductors 114 and 115 is configured to self-couple the output terminals 108 and 106, respectively, of the transconductance amplifier 100.

Typically, each of the transconductors may be configured to exhibit a negative transconductance. That is, an increasing input voltage received at the input port results in an increasing current flowing into the output port. In some cases, however, one or more of the transconductors may be configured to exhibit a positive transconductance. That is, an increasing input voltage received at the input port results in an increasing current flowing out of the output port.

Differential Operation

In cases where the transconductance amplifier 100 is used as a differential operational transconductance amplifier, the pair of input terminals 102 and 104 may be driven by and thus receive a pair of differential input signals comprised of a common-mode voltage component $V_c$ and a differential voltage component $V_{id}$. That is, the pair of differential input signals may be presented as $V_c+\frac{1}{2}V_{id}$ and $V_c-\frac{1}{2}V_{id}$. The pair of differential output signals at the pair of output terminals 106 and 108 may include, respectively, voltage signals $V_{o1}$ and $V_{o2}$ as well as current signals $I_{o1}$ and $I_{o2}$ (where a positive current signal represents current flowing into the output terminals 106 and 108). In differential operation, it can be shown that (in the ideal case where the transconductors have infinite output impedance) the common-mode impedance and the differential impedance of the two output terminals 106 and 108 of the amplifier 100 are given by the following equations:

| Output terminal | Common-mode impedance | Differential impedance |
|---|---|---|
| $V_{o1}, I_{o1}$ | $\dfrac{1}{gm_5 + gm_6}$ | $\dfrac{1}{gm_5 - gm_6}$ |
| $V_{o2}, I_{o2}$ | $\dfrac{1}{gm_4 + gm_3}$ | $\dfrac{1}{gm_4 - gm_3}$ | where $gm_1$, $gm_2$, $gm_3$, $gm_4$, $gm_5$ and $gm_6$ are the transconductance of the transconductors 111, 112, 113, 114, 115 and 116 respectively. If the output terminals 106 and 108 are connected, for example, via a load, the differential output current $I_{od}$ from the transconductance amplifier 100 may be written as $I_{od}=I_{o1}-I_{o2}$, and the differential transconductance gain $gm_d$ may be expressed as the ratio $gm_d=I_{od}/V_{id}$. The differential voltage gain $A_o$ at the output terminals 106 and 108 may be expressed as the product of $gm_d$ and the differential impedances above.

From the table above, it can be seen that the second pair of transconductors 113 and 116 with transconductance $gm_3$ and $gm_6$, respectively, may each be configured to contribute a negative differential impedance to the transconductance amplifier 100, whereas the third pair of transconductors 114 and 115 with transconductance $gm_4$ and $gm_5$, may each be configured to contribute a positive differential impedance to the transconductance amplifier 100. When the positive and negative differential impedances are well matched (i.e. their difference tends towards zero), the differential impedance of the two output terminals 106 and 108 (and hence the differential voltage gain) may be maximized. On the other hand, any mismatch between these impedances, which is a common occurrence in CMOS manufacturing processes featuring minimum geometries of 65-nm or below, may degrade the differential gain or cause undesirable hysteresis.

As described in more detail below, to reduce this mismatch between impedances, at least one of the six transconductors includes a control port, different from any supply power port through which power is supplied to the transconductors. The control port is configured to receive a control signal for adjusting the transconductance of the at least one transconductor. In some embodiments, to allow for greater control over this mismatch, more than one of the six transconductors may be transconductance-adjustable. For example, in one embodiment, to allow control over the positive differential impedance to reduce mismatch, transconductors 113 and 116 may be adjustable (i.e. with $gm_3$ and $gm_6$ separately adjustable so that the differences $gm_5$–$gm_6$ and $gm_4$–$gm_3$ are separately adjustable). As another example, to allow control over the negative differential impedance to reduce mismatch, transconductors 114 and 115 may be adjustable (i.e. with $gm_4$ and $gm_5$ separately adjustable so that the differences $gm_5$–$gm_6$ and $gm_4$–$gm_3$ are also separately adjustable). In another embodiment, all six transconductors may be transconductance-adjustable and may each include a respective control port, different from any supply power port, for receiving a respective control signal thereby to adjust the transconductance of the respective transconductors. This embodiment has an additional functionality of allowing for adjustment of the overall transconductance and/or the total power dissipated.

The description hereinafter focuses on configuration and operation of a single transconductance-adjustable transconductor (hereinafter simply referred to as an "adjustable transconductor") but is understood to be equally applicable to any of the possible six adjustable transconductors, either in the same or different configurations as described below.

Adjustable Transconductor Structure

FIGS. 2A, 2B, 3A and 3B illustrate examples of an adjustable transconductor. In FIG. 1 and in these drawings, wherever possible, the same or like reference numbers have been used to refer to the same or like elements of the various embodiments.

Figure 2A:
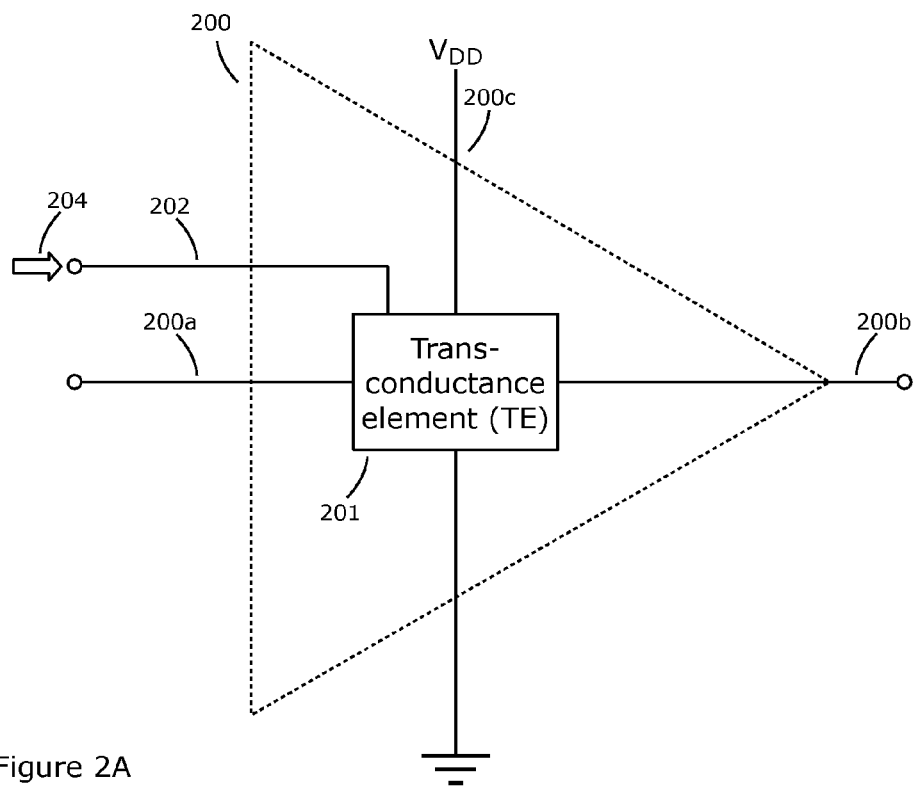
FIG. 2A illustrates a schematic diagram of an adjustable transconductor to form part of the transconductance amplifier of FIG. 1.

Referring to FIG. 2A, the adjustable transconductor 200 includes an input port 200a, an output port 200b, a power supply port 200c for receiving power from a power supply and a control port 202, different from the power supply port 200c, for receiving a control signal 204 for adjusting the transconductance of the transconductor 200.

An adjustable transconductor may include a single transconductance element (TE), i.e. an element whose transconductance is switchable between two values, or multiple transconductance elements. In the examples illustrated in FIGS. 2A and 2B, the adjustable transconductor 200 consists of a single transconductance element, which has a corresponding receiving port for each of the input port 200a, the output port 200b, the control port 202, and the power supply port 200c. In the examples illustrated in FIGS. 3A and 3B, the adjustable transconductor 300 includes an array of transconductance elements.

Figure 2B:
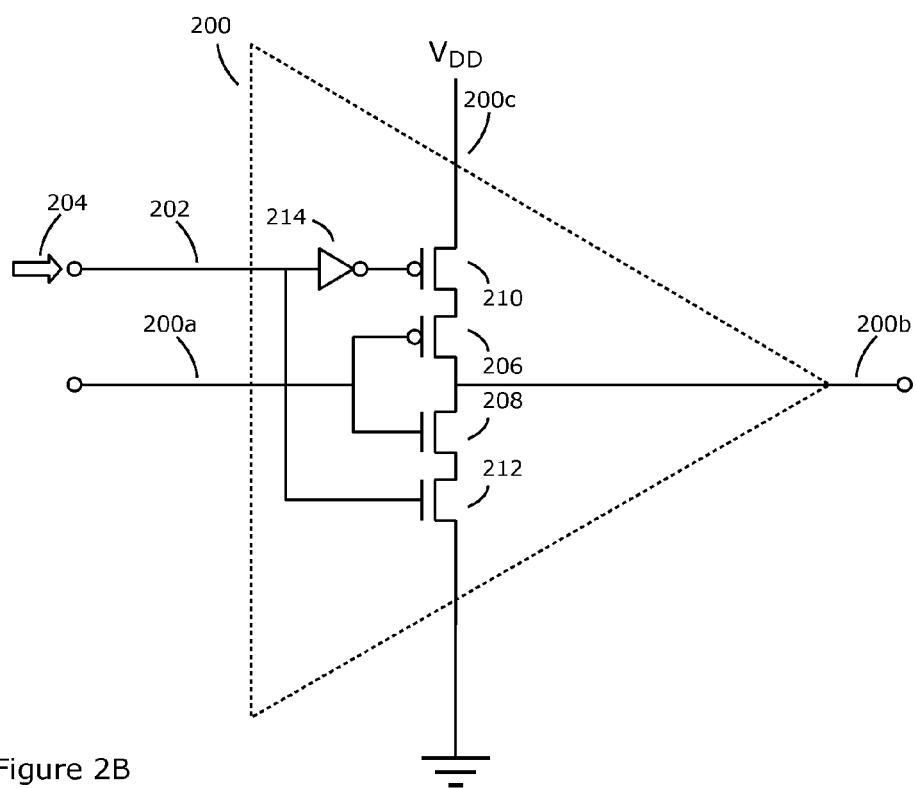
FIG. 2B illustrates an example of an adjustable transconductor with a single transconductance element to form part of the transconductance amplifier of FIG. 1.

FIG. 2B illustrates one configuration of an adjustable transconductor 200 with a single transconductance element. The transconductance element may include a pair of complementary transistors of opposite polarity, such as a p-channel MOSFET (metal-oxide-semiconductor field-effect transistor) 206 and an n-channel MOSFET 208, coupled in a push-pull configuration. This push-pull stage defines a signal path through the transconductance element. That is, the input of the push-pull stage is electrically coupled with the gate terminals of the complementary transistors 206 and 208 and with the input port 200a of the adjustable transconductor 200. Similarly, the output of the push-pull stage (that is, the mutually connected drain terminals of the complementary transistors 206 and 208) is coupled with the output port 200b of the adjustable transconductor 200. The pair of complementary transistors 206 and 208 may be fabricated using CMOS technology.

The transconductance element may further include a pair of control transistors 210 and 212, each coupled in a totem-pole configuration (that is, coupling of transistors of the same polarity in series) with a respective one of the pair of complementary transistors 206 and 208. For example, the control transistor 210 is a p-channel MOSFET coupled with the p-channel MOSFET 206, whereas the control transistor 212 is an n-channel MOSFET coupled with the n-channel MOSFET 208. Furthermore, the control port 202 of the adjustable transconductor 200 is coupled with the pair of control transistors 210 and 212. The pair of control transistors 210 and 212 may be fabricated using CMOS technology.

A logic inverter 214 may be placed between the control port 202 and the p-channel control transistor 210. Apart from the logic inversion, the control signal 204 is therefore receivable at the respective gate terminals of the control transistors 210 and 212. With the logic inverter 214, the pair of control transistors 210 and 212 is configured to receive a pair of complementary control signals derived from the control signal 204. In this configuration of the transconductance element, the pair of control transistors 210 and 212 may be directly coupled to the power supply rails. For example, the p-channel MOSFET 210 may be directly coupled to a power supply at supply voltage $V_{DD}$ whereas the n-channel MOSFET 212 may be directly coupled to ground.

As mentioned, the at least one of the six transconductors is an adjustable transconductor whose transconductance is adjustable via the control port. For completeness, any transconductors that are not adjustable via the control port 202 may have the same structure or construction as its adjustable counterpart, but with a control signal 204 set to a fixed value. Alternatively a nonadjustable transconductor may couple the pair of complementary transistors 206 and 208 directly to the supply voltage rails and, unlike its adjustable counterpart, may not include the logic inverter 214 and the pair of control transistors 210 and 212, with the supply voltage rails being directly coupled to the pair of complementary transistors 206 and 208. In some cases, even if a transconductor may not be transconductance-adjustable via a control port, it may be possible to additionally or alternatively adjust to some extent its transconductance via the power supply port connected to an adjustable supply voltage $V_{DD}$.

Adjustable Transconductor Operation

The operation of the transconductance element of FIG. 2B is now described. The control port 202 is configured to receive either a logic-high or a logic-low control signal 204. When the control signal 204 is at a logic high, a logic low (via logic inverter 214) is present at the gate terminal of control transistor 210 which is therefore enabled or switched on. Similarly, a logic high is present at the gate terminal of control transistor 212 which is therefore also enabled or switched on. When both control transistors are switched on, the source terminal of the p-channel MOSFET 206 is pulled up at VDD and the source terminal of the n-channel MOSFET 208 is pulled down to ground (i.e. control transistors 210 and 212 may each be effectively replaced by a closed connection), so that the transconductance element 201 effectively operates as a push-pull stage in which the output signal is the inverted (and typically amplified) version of the input signal. In other words, when the control signal 204 is at a logic high, the transconductance element is enabled and the transconductance seen between the input port 200a and the output port 200b is approximately the transconductance (denoted as gm) of the push-pull stage.

On the other hand, when the control signal 204 is at a logic low, a logic high is present at the gate terminal of the control transistor 210 which is therefore disabled or switched off. Similarly, a logic low is present at the gate terminal of the control transistor 212 which is therefore also disabled or switched off. In this case, both the p-channel MOSFET 206 and the n-channel MOSFET 208 are unaffected by or disconnected from the supply rails (i.e. the control transistors 210 and 212 are effectively replaced by an open connection) and no current flows through the output terminal of the adjustable conductor. In other words, when the control signal 204 is at a logic low, the transconductance element is disabled or switched off and the transconductance seen between the input port 200a and the output port 200b is zero.

Accordingly, depending on the logic level of the control signal 204, the transconductance element may be enabled or disabled, thereby switching the transconductance of the transconductance element between two values, namely zero and a nominal transconductance.

Where the adjustable transconductor is based on the transconductance element implemented using transistors exemplified in FIG. 2B, the non-idealities affect the output impedance and must be accounted for. The conductance of the combination of the push-pull and of the control transistors when switched on (i.e. to enable the transconductance element) may contribute to the overall transconductance of the adjustable transconductor and thereby modify the common-mode and differential impedance of the transconductance amplifier 100 as follows:

| Output terminal | Common-mode impedance | Differential impedance |
|---|---|---|
| $V_{o1}, I_{o1}$ | $\dfrac{1}{gm_5 + gm_6 + (g_{o1} + g_{o5} + g_{o6})}$ | $\dfrac{1}{gm_5 - gm_6 + (g_{o1} + g_{o5} + g_{o6})}$ |
| $V_{o2}, I_{o2}$ | $\dfrac{1}{gm_4 + gm_3 + (g_{o2} + g_{o3} + g_{o4})}$ | $\dfrac{1}{gm_4 - gm_3 + (g_{o2} + g_{o3} + g_{o4})}$ | where $gm_3$, $gm_4$, $gm_5$ and $gm_6$ represent the nominal transconductance of the respective push-pull stages in the transconductors 113, 114, 115 and 116 of FIG. 1, and the additional terms $g_{o1}$, $g_{o2}$, $g_{o3}$, $g_{o4}$, $g_{o5}$ and $g_{o6}$ are the output conductance of the six respective transconductors. The effects of the additional terms apply regardless of whether the transconductors are adjustable and, where the transconductors are adjustable, the output conductance values typically depend on the setting or the configuration of the adjustable transconductors.

It should be noted that the transconductance element, as illustrated in FIG. 2B, may be suitably implemented using a tri-state inverter used in CMOS digital logic circuits. When used in the context of a transconductor amplifier as described above, however, the tri-state inverter does not act as a digital element. Instead, it is used within its linear range so that its output is well between the supply voltage rails. When enabled (i.e. the control port 202 applies a logic high signal 204), the tri-state inverter is configured as a voltage inverter with a negative and substantially linear slope on an output-vs-input curve. This mode of operation is unlike its digital operation in which the output is driven to the full supply voltage rail to represent a logic high if the input to the inverter is a logic low, and the output is driven to ground to represent a logic low if the input to the inverter is a logic high. When disabled (i.e. the control port 202 applies a logic low signal 204), the output has a high-impedance state, which is suitable for an array of inverters connected in parallel so that their respective outputs do not interfere with one another.

Also, in the configuration shown in FIG. 2B, the transconductance element has its control transistors 210 and 212 directly coupled to the power supply rails (e.g. $V_{DD}$ and ground), whereas the transistors 206 and 208 of the push-pull stage are only indirectly coupled with the power supply rails via the control transistors 210 and 212. That port 200c and the control transistor 212 are coupled to ground. In contrast to another tri-state inverter configuration used in digital logic circuits where the control transistors are the inner two transistors and the signal path is defined by two outer transistors (so that the tri-state output signal is maintained at the previous state), the configuration shown in FIG. 2B has the following benefits:

The on-impedance of the control transistors may be reduced by increasing the gate-to-source voltage ($V_{gs}$) of these transistors. Accordingly the control transistors may be switched on harder when the source terminal of the NFET (PFET) is at ground ($V_{DD}$) because of an increased $V_{gs}$.

The impact of having internal nodes on bandwidth may be minimized by coupling the control transistors with the supply rails because the internal nodes created may be held at a near constant voltage. Keeping the voltage at these internal nodes near constant is assisted by the parasitic capacitances of the drain terminal of the control transistors and the source terminal of the complementary transistors. In comparison, if the complementary transistors are coupled to the supply rails, both the source and drain terminals of the control transistors are in the signal path and their parasitic capacitances have to be added to the parasitic capacitance of the drain terminals of the complementary transistors, reducing the bandwidth of the amplifier.

Adjustable Transconductor with Multiple Switchable Elements

Figure 3A:
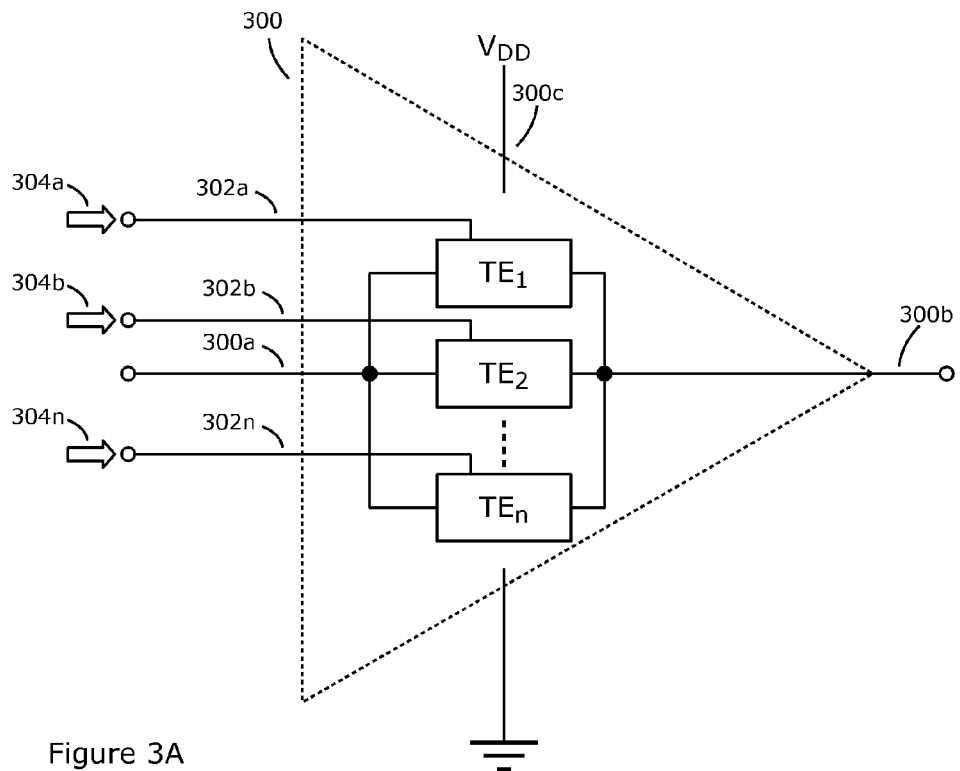
FIG. 3A illustrates another example of an adjustable transconductor with an array of transconductance elements to form part of the transconductance amplifier of FIG. 1.

To construct an adjustable transconductor that may allow for a larger range of adjustable values, the adjustable transconductor of FIG. 2A or 2B may be configured to include multiple transconductance elements, each having its transconductance switchable between two values. As illustrated in FIG. 3A, an adjustable transconductor 300 may include an array of transconductance elements $TE_1$, $TE_2$, ... $TE_n$, each of which may have a transconductance value switchable by the respective one of a plurality of control signals 304a, 304b ... 304n between zero and its nominal transconductance $gm_{TE1}$, $gm_{TE2}$ ... $gm_{TEn}$. Each transconductance element $TE_1$, $TE_2$, ... $TE_n$ may have its own power supply port (not shown) for receiving power from a power supply at voltage $V_{DD}$. Where the array of transconductance elements $TE_1$, $TE_2$, ... $TE_n$ are connected in parallel, the effective transconductance of the adjustable transconductor 300 is the sum of the transconductances of all enabled transconductance elements $TE_1$, $TE_2$, ... $TE_n$. For example, if all transconductance elements $TE_1$, $TE_2$, ... $TE_n$ are enabled, the effective transconductance of the adjustable transconductor 300 is $gm_{TE1}+gm_{TE2}+ \ldots +gm_{TEn}$. As another example, if only transconductance elements $TE_1$ and $TE_2$ are enabled, the effective transconductance of the adjustable transconductor 300 is $gm_{TE1}+gm_{TE2}$. As yet another example, if none of the transconductance elements $TE_1$, $TE_2$, ... $TE_n$ are enabled, the effective transconductance of the adjustable transconductor 300 is zero. Therefore, the effective transconductance of the adjustable transconductor 300 is adjustable by individually enabling or disabling the transconductance elements $TE_1$, $TE_2$, ... $TE_n$.

In one embodiment, the array of transconductance elements $TE_1$, $TE_2$, ... $TE_n$ may include a thermometer encoded array of transconductance elements. That is, the transconductance elements $TE_1$, $TE_2$, ... $TE_n$ all have the same weight such that $gm_{TE1}=gm_{TE2}=\ldots=gm_{TEn}$. The effective transconductance of the adjustable transconductor is M×gm where M is the number of enabled transconductance elements. In an alternative embodiment, the array of transconductance elements $TE_1$, $TE_2$, ... $TE_n$ may include a binary weighted array of transconductance elements. That is, the transconductance elements in which each subsequent element has a transconductance that is double the transconductance of a previous element such that $gm_{TE1}=2\times gm_{TE2}=4\times gm_{TE3}=\ldots=2^{n-1}\times gm_{TEn}$. In these two embodiments, therefore, the smallest unit of adjustable transconductance is $gm_{TEn}$.

In other embodiments, arrays with other transconductance weightings or ratios may be used. Also, arrays with a different number of elements for a different adjustable transconductor may be used. As an illustrative example, an 8-element array with transconductance ratios of 1:2:4:4:4:8:16:32 may be used in one transconductor (such as transconductor 111 of FIG. 1), whereas in another transconductor a 6-element array with transconductance ratios of 32:31:30:28:24:16 (i.e. a ratio sequence of $2^5$ and $2^5-2^n$ where n is selected from the group 0, 1, 2, 3 and 4) may be used (such as transconductor 112 of FIG. 1). A ratio sequence of $2^5-2^n$ may provide more granular transconductance matching since the maximum transconductance ratio between any two elements is 2.

One way of achieving a particular sequence of weightings or ratios of transconductance (gm) may be by scaling the gate width (W) and gate length (L) ratio of the field-effect transistors used in the array. To a first approximation, gm is proportional to W/L. For example, a fixed gate length L may be used for all elements in an array, whereas the individual elements may have an increasing gate width W, 2 W and 4 W to achieve transconductances gm, 2 gm and 4 gm. In some cases, elements with a desired transconductance larger than 4 gm may be constructed with a combination of field-effect transistors having gate widths W, 2 W and 4 W connected in parallel.

Where the field-effect transistors are fabricated on an integrated circuit, W and L may both be controlled during the fabrication process.

Each of the transconductance elements $TE_1$, $TE_2$, ... $TE_n$ in the array may assume the form of the transconductance element (201) illustrated in FIGS. 2A and 2B.

Figure 3B:
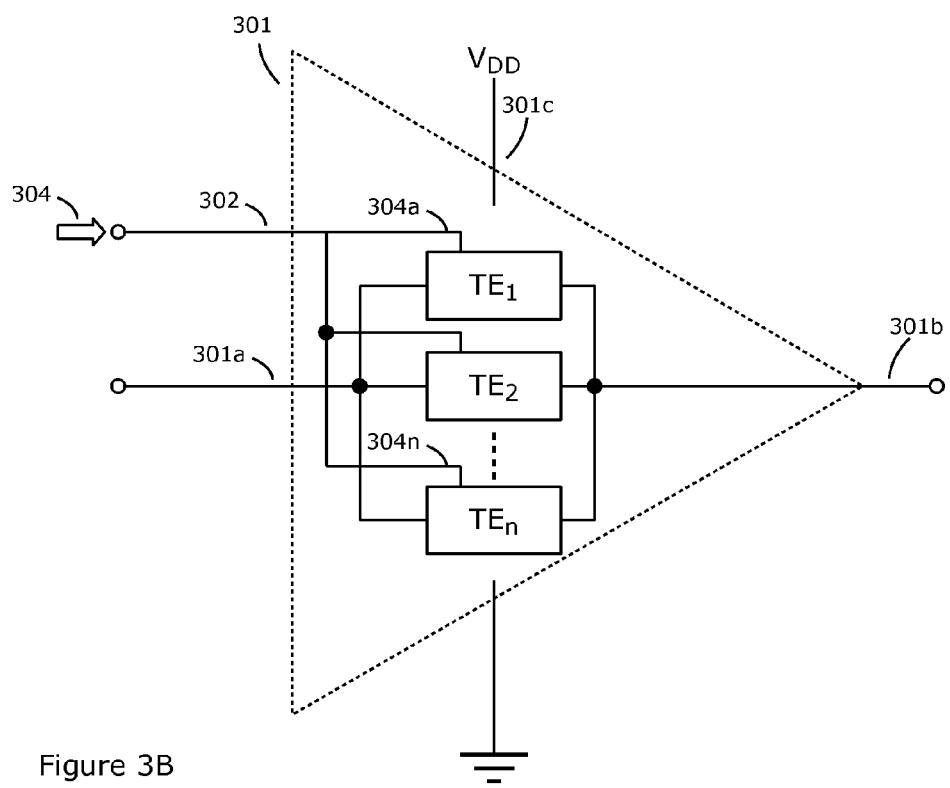
FIG. 3B illustrates yet another example of an adjustable transconductor with an array of transconductance elements to form part of the transconductance amplifier of FIG. 1.
Figure 4:
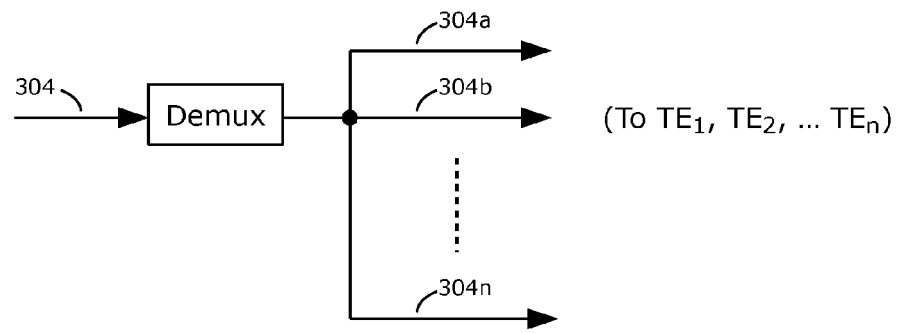
FIG. 4 illustrates a schematic diagram of a demultiplexer for splitting or demultiplexing a control signal of the transconductor amplifier of FIG. 1 into a number of digital control signals.

Since control signals 304a, 304b ... 304n may enable (or disable) the respective transconductance elements by taking a logic high (or logic low), the control signals 304a, 304b ... 304n may be a plurality of digital control signals, for enabling or disabling the associated transconductance elements $TE_1$, $TE_2$, ... $TE_n$. In the embodiment illustrated in FIG. 3A, the transconductance elements in adjustable transconductor 300 may each include a separate associated control ports 302a, 302b ... 302n for separately receiving an associated control signal. In an alternative embodiment, as illustrated in FIG. 3B, the adjustable transconductor 301 may include a single control port 302 for receiving a control bus signal 304 which may include the plurality of digital control signals 304a ... 304n. The adjustable transconductor 301 may further include a demultiplexer 400 (shown in an example embodiment in FIG. 4) for splitting or demultiplexing the control bus signal 304 into the individual digital control signals 304a, 304b ... 304n.

Figure 5:
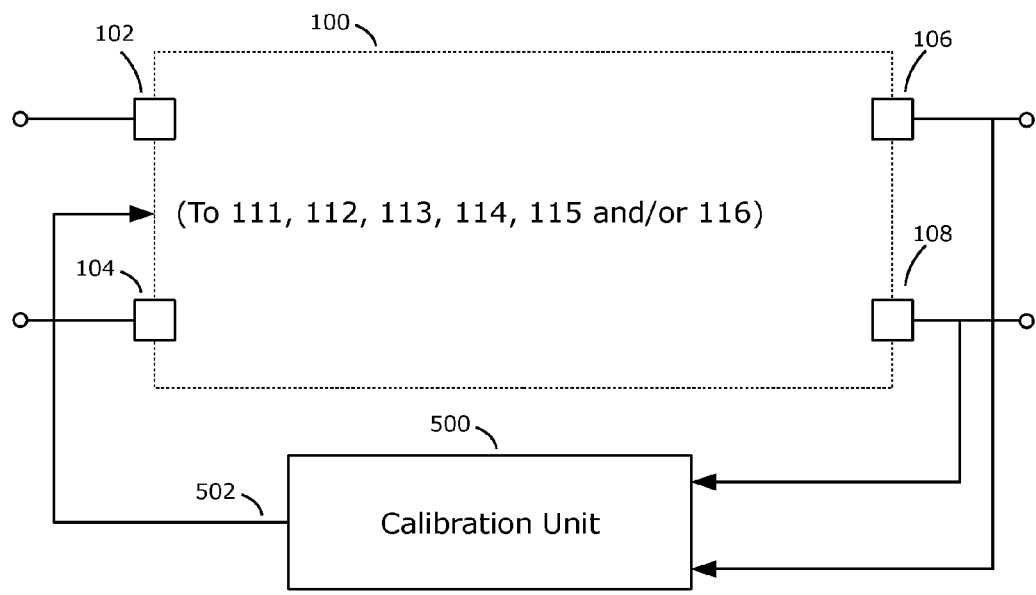
FIG. 5 illustrates the use of a calibration unit for providing feedback based on an output of an embodiment of the transconductance amplifier in accordance with the present invention.

FIG. 5 illustrates the use of a calibration unit for providing feedback based on an output of an embodiment of the transconductance amplifier in accordance with the present invention. The transconductance amplifier 100, 200, 300, or 301 may include a calibration unit for providing feedback for a control signal based at least partly on the output signal of the amplifier. As illustrated, a calibration unit 500 may be coupled to the output terminals of the transconductance amplifier 100 for sampling or monitoring the output and, based on the output, provide a calibration signal 502 for altering the control signal for each adjustable transconductor. For example, the calibration signal 502 may be representative of, or associated with, a target transconductance value for each of the adjustable transconductors.

The calibration unit 500 may be configured to minimize hysteresis or optimize the amplifier gain (i.e. minimize the mismatch between the positive and the negative impedance) in several ways. In one embodiment, the amplifier 100 may be calibrated "offline", i.e. when it is not in active use for amplification. The calibration unit 500 may provide an initial calibration signal 502 associated with an initial target transconductance value with which the amplifier output is sampled. The calibration unit 500 may then provide a new calibration signal to slightly deviate (e.g., increase) the target transconductance value from its previous value and again sample a new amplifier output. If the new amplifier output is determined by the calibration unit 500 to be greater than its previous value and/or exhibit reduced hysteresis, then the calibration unit 500 may deviate the target transconductance in the same direction (e.g., increase) until a maximum gain with little or no hysteresis is attained. If, however, the new amplifier output is determined by the calibration unit 500 to be less than its previous value and/or exhibit increased hysteresis, then the calibration unit 500 may deviate the target transconductance in the opposite direction (e.g., decrease) until a maximum gain with little or no hysteresis is attained. Since there may be, for instance, six adjustable transconductors, the calibration unit 500 may be adapted to produce a calibration signal 502 for altering up to six control signals, one for each adjustable transconductor. Accordingly, the gain and hysteresis optimization may involve up to 6 degrees of freedom.

In another embodiment, the amplifier 100 may be calibrated "online", i.e. while it is in active use for amplification. Regardless of the optimization routine and number of degrees of freedom used, the calibration signal 502 may provide real time feedback as the calibration unit 500 continuously monitors the amplifier output. Calibration in this embodiment may involve performing measurement of a predetermined property of a signal that is known to have a good correlation to the gain and/or hysteresis of the amplifier 100. Calibration may be performed by measuring the predetermined property instead of the gain or output of the amplifier 100.

Now that a number of embodiments of the transconductance amplifier have been described, it should be apparent to a person skilled in the art that the present invention has at least the following advantages:

The transconductance amplifier may have a high bandwidth. Although there are internal nodes in the circuit (that is, between the complementary transistors and control transistors), the control transistors are digitally controllable and designed to be always switched on or off completely, so that the nodes are held at constant voltage and have a low impedance to ground or supply rail when enabled.

The mismatch between positive and negative impedances may be digitally controllable and therefore reduced so that the voltage gain of the transconductance amplifier may also be digitally controllable and optimized.

Those skilled in the art will appreciate that the invention described herein is susceptible to variations and modifications other than those specifically described. For example, each adjustable transconductor may have a different number of transconductance elements. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

We claim:

1. A transconductance amplifier comprising:
   a pair of input terminals for receiving an input signal;
   a pair of output terminals for providing an output signal;
   a first pair of transconductors each comprising:
      an input port electrically coupled with a respective one of the pair of input terminals; and
      an output port electrically coupled with a respective one of the pair of output terminals;
   a second pair of transconductors each comprising:
      an input port electrically coupled with a respective one of the pair of output terminals; and
      an output port electrically coupled with the other of the pair of output terminals;
   a third pair of transconductors each comprising:
      an input port; and
      an output port electrically coupled with its input port and also with a respective one of the pair of output terminals,
   wherein at least one of the transconductors includes a control port, different from a power supply port, wherein the control port is configured to receive a control signal for adjusting a transconductance of the at least one of the transconductors.

2. The transconductance amplifier of claim 1, wherein the at least one of the transconductors includes a transconductance element of which a transconductance is switchable between two values by the control signal.

3. The transconductance amplifier of claim 2, wherein the transconductance element is configured to be enabled or disabled by the control signal.

4. The transconductance amplifier of claim 1, wherein the at least one of the transconductors comprises an array of transconductance elements each of which includes an associated control port, different from any power supply port, with the transconductance of each transconductance element being switchable between two values by an associated control signal received via the associated control port.

5. The transconductance amplifier of claim 4, wherein the transconductance elements is configured to be enabled or disabled by the associated control signal.

6. The transconductance amplifier of claim 4, wherein the array of transconductance elements are connected in parallel such that an effective transconductance of the at least one of the transconductors equals the sum of transconductance of all enabled transconductance elements.

7. The transconductance amplifier of claim 6, wherein the array of parallel-connected transconductance elements includes a thermometer encoded array of transconductance elements, each transconductance element having the same transconductance.

8. The transconductance amplifier of claim 6, wherein the array of parallel-connected transconductance elements includes a binary weighted array of transconductance elements in which each subsequent element has a transconductance value double a transconductance value of a previous element.

9. The transconductance amplifier of claim 1, wherein:
   the second pair of transconductors is configured to contribute a negative differential impedance to the transconductance amplifier; and
   the third pair of transconductors is configured to contribute a positive differential impedance to the transconductance amplifier.

10. The transconductance amplifier of claim 9, wherein the transconductance of the at least one of the transconductors can be adjusted to reduce any mismatch between the negative differential impedance and the positive differential impedance.

11. The transconductance amplifier of claim 2, wherein:
the transconductance element includes a pair of complementary transistors of opposite polarity coupled in a push-pull configuration;
the transconductance element includes a pair of control transistors each coupled in a totem-pole configuration to a respective one of the pair of complementary transistors;
at least one of the pair of control transistors is coupled with the power supply port;
the pair of control transistors is configured to be both enabled or disabled by a pair of complementary control signals; and
the pair of complementary control signals is receivable at respective gate terminals of the pair of control transistors.

12. The transconductance amplifier of claim 1, comprising CMOS transistors.

13. The transconductance amplifier of claim 2, wherein the transconductance element is in the form of a tri-state inverter configured to operate substantially in its linear range, the tri-state inverter comprising an input port, an output port and a control port configured to receive the control signal.

14. The transconductance amplifier of claim 13, wherein the tri-state inverter includes an enable port for receiving a control signal for enabling or disabling the tri-state inverter.

15. The transconductance amplifier of claim 13, wherein each of the transconductors includes a tri-state inverter.

16. The transconductance amplifier of claim 13, wherein the tri-state inverter is one of an array of tri-state inverters.

17. The transconductance amplifier of claim 1, wherein the transconductance amplifier further comprises a calibration unit for providing feedback for the control signal based at least partly on the output signal.

18. The transconductance amplifier of claim 17, wherein the feedback for the control signal is representative of, or associated with, a target transconductance for each of the at least one of the transconductors.

19. The transconductance amplifier of claim 1, wherein the second pair of transconductors includes a respective control port, different from any power supply port, for receiving a respective control signal for adjusting a transconductance of the respective transconductor.

20. The transconductance amplifier of claim 19, wherein each of the transconductors includes a respective array of transconductance elements.

21. The transconductance amplifier of claim 1, wherein the third pair of transconductors includes a respective control port, different from any power supply port, for receiving a respective control signal for adjusting a transconductance of the respective transconductor.

22. The transconductance amplifier of claim 21, wherein each of the transconductors includes a respective array of transconductance elements.

23. The transconductance amplifier of claim 1, wherein each of the transconductors includes a respective control port, different from any power supply port for receiving power, for receiving a respective control signal for adjusting a transconductance of the respective transconductor.

24. The transconductance amplifier of claim 23, wherein each of the transconductors includes a respective array of transconductance elements.

* * * * *